United States Patent [19]

Kowalski

[11] Patent Number: 5,740,403
[45] Date of Patent: Apr. 14, 1998

[54] PROCESS CIRCUIT & SYSTEM FOR PROTECTING AN INTEGRATED CIRCUIT AGAINST FRAUDULENT USE

[75] Inventor: Jacek Kowalski, Trets, France

[73] Assignee: Gemplus Card International, Gemenos, France

[21] Appl. No.: 90,117

[22] PCT Filed: Feb. 18, 1992

[86] PCT No.: PCT/FR92/00157
§ 371 Date: Jul. 14, 1993
§ 102(e) Date: Jul. 14, 1993

[87] PCT Pub. No.: WO92/15074
PCT Pub. Date: Sep. 3, 1992

[30] Foreign Application Priority Data

Feb. 19, 1991 [FR] France ................. 91 01933

[51] Int. Cl.⁶ ................................................. G06F 12/14
[52] U.S. Cl. ................. 395/491; 395/188.01; 235/492
[58] Field of Search ........................... 395/425, 400,
395/442, 188.01, 430, 479, 488, 490, 491;
235/449, 380, 375, 492; 364/DIG. 1; 380/4

[56] References Cited

U.S. PATENT DOCUMENTS

| 4,211,919 | 7/1980 | Ugon | 235/487 |
|---|---|---|---|
| 4,446,475 | 5/1984 | Gercekci et al. | 357/40 |
| 4,650,975 | 3/1987 | Kitchener | 235/375 |
| 5,012,074 | 4/1991 | Masada | 235/379 |
| 5,039,850 | 8/1991 | Yamaguchi | 235/492 |
| 5,206,938 | 4/1993 | Fujioka | 395/410 |
| 5,237,609 | 8/1993 | Kimura | 380/3 |

FOREIGN PATENT DOCUMENTS

| 0353530 | 7/1989 | European Pat. Off. . |
|---|---|---|
| 2471004 | 11/1979 | France . |
| 2613102 | 3/1988 | France . |

*Primary Examiner*—Eddie P. Chan
*Assistant Examiner*—Hiep T. Nguyen
*Attorney, Agent, or Firm*—Roland Plottel

[57] ABSTRACT

A process to protect against tampering with integrated circuits. During manufacture, a secret code is written in a secret address (102) of a memory (101) of the integrated circuit and an internal logic (103–108) blocks writing into this portion of memory, the testing of the integrated circuit and the read-out of data. In order to unlock the integrated circuit, the secret address is read while applying a secret code to an input of the integrated circuit. A comparison (207) of the secret code as read and the secret code applied to the integrated circuit then either locks or unlocks the integrated circuit. This unlocking is done in irreversible manner. Thus, it is possible to transport integrated circuits between a manufacturer and a remote users, without fear of the circuits being stolen, because if stolen, they would be inoperable without the secret codes.

19 Claims, 1 Drawing Sheet

PROCESS CIRCUIT & SYSTEM FOR PROTECTING AN INTEGRATED CIRCUIT AGAINST FRAUDULENT USE

BACKGROUND OF THE INVENTION

1. Field of the Invention

The present invention relates to processes making it possible to protect integrated circuits against fraudulent use by unauthorized persons. It more particularly applies to integrated circuits for use in chip/smart cards, as well as specialized circuits known as ASIC, which often represent the essential feature for the performance characteristics of the equipment in which they are used. All these circuits have at least one memory and a varying number of logic circuits, which may extend to the formation of a micro-processor.

2. Description of the Prior Art

It is standard practice for chip card manufacturers to test the circuit and then prepersonalize it by entering into its memory a certain number of data more specifically defining its functions. In order to prevent fraudulent use, particularly in the case of theft during transportation between the manufacturer and the client, into said data is introduced a confidential code concealed among the other data. On receiving the card the customer, who has become aware of the confidential code in some other way, validates the latter by introducing the code into the card in accordance with a predetermined procedure.

It frequently arises that the card manufacturer is not the same as the circuit manufacturer and that these two manufacturers are based at locations remote from one another. It is therefore necessary to transfer a large number of circuits with a small volume, because they are not installed in the cards. The installation of the circuits in the cards is difficult, but does not lead to excessive problems and the personalization of the card is very simple, because the data written in the memory are not particularly confidential, because they are usually readable in cards regularly put into circulation. As for the test requirements, prior to installation and personalization, all the memory cells must be accessible in reading/writing, it is merely necessary to write the data into the same.

There is then a considerable risk of unauthorized user gaining possession of circuits and carrying out these operations in order to use the cards to his own advantage and in particular for acquiring the money to which they give access in plastic money uses. This risk increases in view of the fact that a single packet of circuits can have a very considerable exchange value. Therefore considerable precautions must be taken during such transportation processes and they lead to high costs and to significant delays.

SUMMARY OF THE INVENTION

In order to protect the circuits against such risks, the invention proposes a process for the protection of an integrated circuit against fraudulent use. The integrated circuit has a memory and logic circuits for controlling the memory. At the time of manufacture of the integrated circuit a physical determination is made, on the basis of the geometry of at least one of the circuit manufacturing masks, of the content of at least one secret address. The content represents a secret code making it possible to lock out at least the writing or at least the reading of at least part of the memory. In order to subsequently unlock the memory, reading is brought about of the secret code contained in the secret address, and a code identical to the logic control circuits is supplied for a comparison unlocking.

BRIEF DESCRIPTION OF THE DRAWINGS

The invention is described in greater detail hereinafter with respect to the following description relative to the attached drawings, wherein.

DETAILED DESCRIPTION OF THE INVENTION

Figure 1:
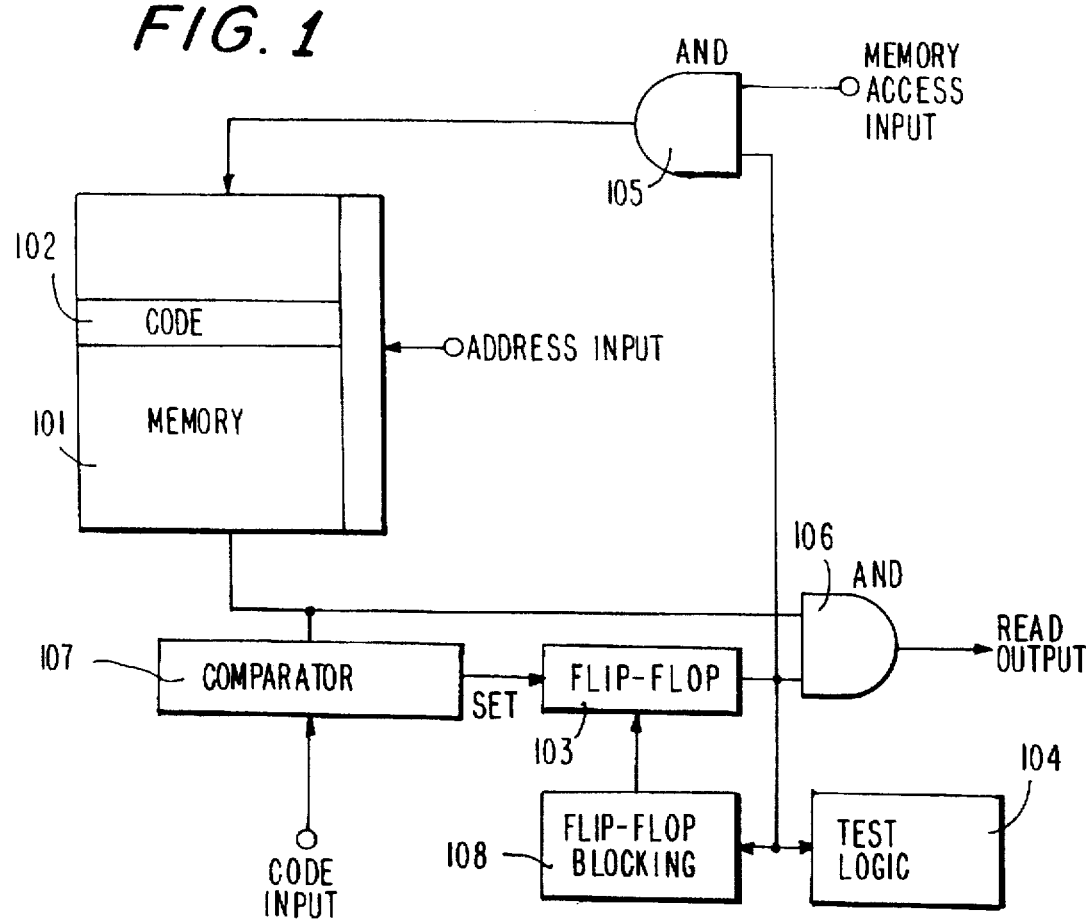
FIG. 1 a partial, schematic diagram of an integrated circuit provided with the protection means according to the invention.

The diagram according to FIG. 1 explains the process according to the invention and is unrelated with the physical reality of the elements forming the integrated circuit equipped with the protection means making it possible to perform the process according to the invention. The elements used in the normal operation of the circuit and which are known per se are not shown.

Therefore this integrated circuit comprises a memory 101 in which are recorded a program and data necessary for its normal use, together with not shown members permitting the processing of such data and the running of the program.

The content of the memory words is written from a writing input and, following reading, is supplied to a reading output. The selection of the address of the written and read words takes place by an address input. Obviously these inputs and outputs pass through not shown processing members.

During the manufacture of the integrated circuit protected according to the invention, into at least one given word of the memory and whose secret address forms part of the protection, is written a given secret code. This writing takes place by physical means during the unplementation of the circuit, by giving at least one of the manufacturing masks an adequate configuration. This word 102 is common to a complete manufacturing batch, which can be a group of semiconductor wafers or, for high security applications, the circuits of a single circuit board. The length of the code varies, once again as a function of the desired level of security, and if said length exceeds that of a single word use is made of several words, which may be separated in the memory, i.e. located at non-contiguous addresses.

As a variant and once again for increasing security, it is possible to use different codes for circuits as a function of their physical location on the wafer forming the common substrate where they are located. Thus, unapproved user who has been able to obtain one code by any random means will not know the others.

During the energizing of the circuit, the not shown starting logic positions a flip-flop 103, whose output is respectively connected to the logic test circuits 104 and to two gates 105,106, which respectively lock the writing input and the reading output, i.e. access to the memory for the user at this moment.

Thus, in this state the circuit cannot be tested and nothing can be written into the memory. The memory content is not available on the circuit outputs. For certain applications, it would be possible as a variant to provide a limited possibility of writing into the memory in order to validate the secret code according to a known procedure. However, it is possible to read the content by addressing the words via the address input which remains free, except for any protected areas.

The data read in this way and which are locked by the gate 106 are applied to a comparator 107, which also receives on a code input the code to be recognized for unlocking access to the circuit.

In order to carry out a fraudulent attempt to unlock the circuit, it would then be necessary to read the entire memory and for each of the read words to try out all the possible code combinations. As soon as the code has a certain length, the time would discourage such attempts.

However, the manufacturer holding the correct code, will directly read the correct address and will enter the correct code into the circuit.

At this instant the comparator recognizes the identity of the external code and the content of the word read in the memory and addresses a said signal to the flip-flop 103, which then changes state, releases the test logic and opens the gates 105 and 106. It is then possible to test the circuit and carry out its prepersonalization. At the end of this stage, the memory consequently has an area in which are entered the prepersonalization data.

To ensure that the circuit is not locked by the flip-flop 103 during the next energization, when it is switched under the control of the comparator 107 it definitively positions a circuit 108, which acts on the flip-flop in order to make it stay in the correct position. For example, said circuit can be a single EPROM cell. It can form part of the starting logic, or can even be directly integrated into the circuits forming the flip-flop.

In the same way, it is preferable to neutralize the content of the word 102 in order on the one hand to have a hole-free memory and on the other prevent someone not having good intentions from reading the secret code contained therein. Thus, said word could be "immersed" in the prepersonalization data, but this solution is not entirely satisfactory.

A better solution is to give the integrated circuit control logic a configuration such that the word 102 disappears from the list of addressable words and substituting for it another word, e.g. the last word in the memory. The configuration of said logic would then take place either by control from the locking circuit 108 or the output of the flip-flop 103, itself locked by the circuit 108, or by circuits within the logic, identical to the circuit 108 and themselves locked during the recognition of the secret code. Besides EPROM cells, it is also possible to use fuses.

Figure 2:
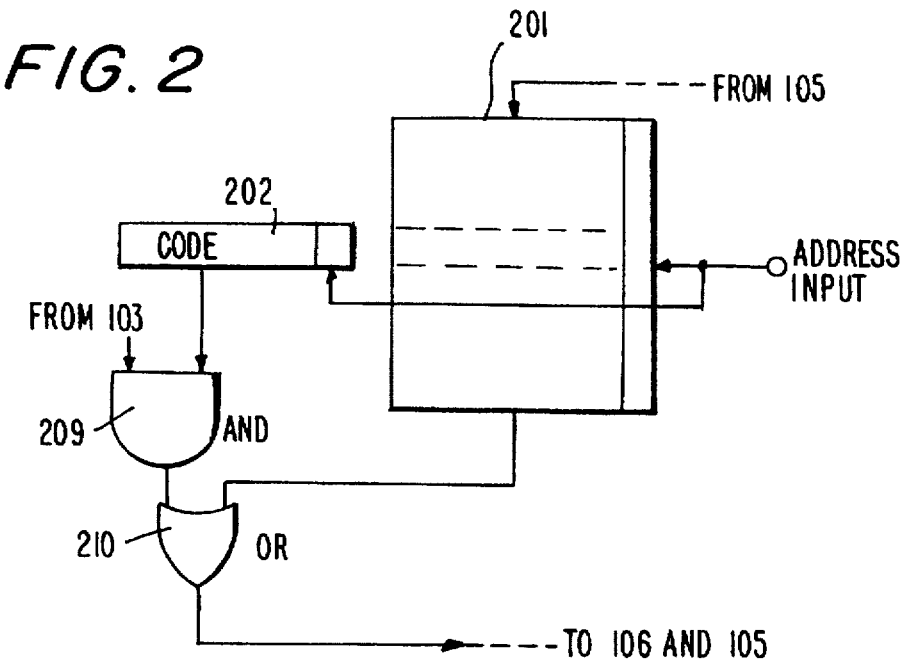
FIG. 2 a partial, schematic diagram of the memory and a register associated with a circuit according to the invention.

As shown in a purely illustrative manner in FIG. 2, the preferred solution uses a register separate from the main memory for recording the secret code. The memory 201 is identical to the memory 101, except that all its words are new. The secret code is contained in a separate register 202 (or optionally a separate memory), whose address is the same as that of the word 102 in the memory 101. Therefore this register is addressed at the same time as that of the corresponding word in the memory 201, shown in dotted line form in the drawing.

Therefore the content of the register 202 is read during the integrated circuit unlocking stage and its content is transferred to the comparator 107 and the gate 106 through an OR gate 209 and an OR gate 210. The content of the word with the same address in the memory 201 is also applied to the OR gate 210, which at this stage is of no significance because it has a zero content. Other arrangements giving an equivalent result would make it possible to not read this word.

If the correct code has been applied to the comparator 107, the sequence described hereinbefore takes place and the flip-flop 103, whose output is also applied to the input of the gate 209, will block the passage of the content from the register 202 to the gate 210, which then only supplies the content of the memory. As the flip-flop subsequently remains locked in the same position, only the memory and not the register 202 will be read.

The remainder of the operation (testing and prepersonalization) is the same as that described hereinbefore.

Here again it is possible to use any other procedure respecting the logic rules described hereinbefore, e.g. a fuse located at the output of the register 202, or on the reading control thereof, or a switching circuit in place of the gate 210.

The main protection is provided by the prevention of writing, followed by the reading output and finally the blocking of the test functions. When the security requirements are not as high, it would merely be necessary to use the first protection measure, or possibly a combination of the first two measures.

It is clear that the invention is not limited to integrated circuits intended for smart cards. It can also be used e.g. for ASIC-type circuits, whose use is reserved for the user who has defined the specifications thereof.

What is claimed is:

1. A process for protecting an integrated circuit against unauthorized use, said integrated circuit incorporating a memory, comprising the steps of during manufacture of the integrated circuit, while the integrated circuit is on a single wafer with other integrated circuits entering a secret code implemented physically in at least one secret address of the memory, by means of the geometery of at least one of the masks used to manufacture said integrated circuit, and provide comparison means within the integrated circuit to lock out at least a writing input of the memory until said comparison means receives on an input the contents of said secret address, and means to enter a code to be compared with said stored code at said address, and if said codes be identical, then running out an unlocking operation.

2. A process according to claim 1, wherein said comparison means also locks out the transmission of the memory output on a read output.

3. A process according to claim 1, said integrated circuit comprising testing circuits to test the memory, wherein said comparison means also locks out said testing circuits.

4. A process according to claim 1, wherein a plurality of integrated circuits on a single wafer are made with the process, and said secret code on at least two of said circuits is implemented in different secret addresses on said at least two circuits.

5. A process according to claim 1, wherein the secret code is implemented in a register separate from the memory but having a same reading address as a word location of the memory, said reading address allowing reading access to said register when the memory is locked, said reading address allowing access to only said word location of the memory when the unlocking operation has been run out.

6. A process according to claim 1, wherein the unlocking operation is made irreversible.

7. A process according to claim 6, wherein fuses within the integrated circuit are used to make said unlocking operation irreversible.

8. A process according to claim 1, wherein many integrated circuits are simultaneously manufactured on the same semiconductor material wafer, each one of said integrated circuits has a corresponding physical location on said wafer, a secret code is determined for each one of said integrated circuits as a function of said physical location.

9. A process according to claim 1, wherein the integrated circuit is of the ASIC type.

10. A method of locking integrated circuit chips comprising the steps of
during manufacture of the chips while said chips are on a single wafer entering at an address in memory on each chip a code word;

providing on each chip a gate at an input to said memory and a gate at an output of said memory through which data to and from the chip will pass said gates being closed blocking transfer of data to and from said memory;

providing on each chip a comparator having an input on which can be submitted an address and a code word, said comparator being capable of retrieving from memory the word at said submitted address and comparing said retrieved code word with said submitted code word;

if said two words coincide, then permanently opening said two gates to permit the flow of data in and out of said chip; and transporting said chips from a manufacturer thereof to a customer while said two gates are in a closed position.

11. The method of claim 10, comprising after said opening of said gates the step of permanently inhibiting reading of said code word in said memory.

12. The method of claim 10, wherein the step of entering said code words in said chips comprises selecting and entering different code words for different chips on the same wafer.

13. The method of claim 10, wherein the step of entering said code words on said chips comprises, entering said code words at different addresses on different chips on the same wafer.

14. The method of claim 10, further comprising the steps of transmitting the addresses and code words of each chip to the customer separately from the transportation of the chips.

15. The method of claim 10, comprising after said step of opening the gates, the step of neutralizing said code word at said address.

16. The method of claim 10, comprising after said step of opening the gates, the step of removing said address of said code word from a list of addressable words.

17. A method of locking integrated circuit chips comprising the steps of during manufacture of the chips while said chips are on a single wafer entering at an address in memory on each chip a code word;

providing on each chip a gate at said memory through which data to/from the chip will pass said gate being closed blocking transfer of data to/from said memory;

providing on each chip a comparator having an input on which can be submitted an address and a code word, said comparator being capable of retrieving from memory the word at said submitted address and comparing said retrieved code word with said submitted code word;

if said two words coincide, then permanently opening said gate to permit the flow of data in/out of said chip; and transporting said chips from a manufacturer thereof to a customer while said gates is in a closed position.

18. A protection circuit in an integrated circuit having an ROM memory; said protection circuit comprising (a) a preset secret code of data at an address (102) in said ROM memory (101);

(b) a gate (103) connected to said memory and through which passes contents of the memory, said gate being initially closed at the time of manufacture and shipment to a customer so that no data passes therethrough;

(c) comparator means (107) connected to said memory and having an input on which is entered a secret code of data including an address in said memory, said comparation means fetching from said memory at said entered address any data thereat, and comparing said fetched data with said entered data, and if the comparison agrees then generating an output signal to said gate rendering said gate permanently open; and (d) means for rendering unreadable said secret code of data in said memory after said gate is open;

whereby said memory of said integrated circuit is inaccessable without said secret code, and said integrated circuit may be transported from said manufacturer with a lessened degree of security because an unauthorized user does not know the secret code and thus would have difficulty in getting the circuit to work.

19. An integrated circuit comprising a memory with input/output terminals, a gate at one of said memory terminals, said gate initially being in the locked state so that nothing passes there through to or from said memory, a stored secret code of a data word stored at a location in memory, a comparator connected to said memory which can access said memory, and retrieve from said accessed location a data word stored thereat, an external input to said integrated circuit connected to said comparator, and on which is inputted a secret code of (i) a location in memory and (ii) a data word; and said comparator retrieving a data word from said inputted location in memory, and comparing said inputted data word with the retrieved data word, and if said data words agree then generating an unlock signal to said gate to unlock said memory.

* * * * *